United States Patent
Thomas et al.

(10) Patent No.: US 7,294,910 B2
(45) Date of Patent: Nov. 13, 2007

(54) ELECTRONIC COMPONENT WITH MULTILAYERED REWIRING PLATE AND METHOD FOR PRODUCING THE SAME

(75) Inventors: Jochen Thomas, Munich (DE); Ingo Wennemuth, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/519,444

(22) PCT Filed: Jun. 30, 2003

(86) PCT No.: PCT/DE03/02162

§ 371 (c)(1),
(2), (4) Date: Aug. 26, 2005

(87) PCT Pub. No.: WO2004/004006

PCT Pub. Date: Jan. 8, 2004

(65) Prior Publication Data

US 2006/0043539 A1    Mar. 2, 2006

(30) Foreign Application Priority Data

Jul. 1, 2002    (DE)    ................. 102 29 542

(51) Int. Cl.
*H01L 23/552*    (2006.01)
(52) U.S. Cl. .................................... 257/659
(58) Field of Classification Search ................ 257/659, 257/660; 438/731
See application file for complete search history.

(56) References Cited

U.S. PATENT DOCUMENTS

| | | | |
|---|---|---|---|
| 4,396,464 A | 8/1983 | Giner et al. | |
| 4,642,716 A | 2/1987 | Wakabayashi et al. | |
| 4,749,625 A * | 6/1988 | Obayashi et al. | 428/624 |
| 5,068,697 A * | 11/1991 | Noda et al. | 257/315 |
| 6,525,385 B2 * | 2/2003 | Inoue et al. | 257/421 |
| 6,906,396 B2 * | 6/2005 | Tuttle et al. | 257/433 |
| 7,084,770 B2 * | 8/2006 | Brady et al. | 340/572.7 |
| 2002/0050632 A1 | 5/2002 | Tuttle | |
| 2002/0081772 A1 | 6/2002 | Madrid et al. | |

FOREIGN PATENT DOCUMENTS

| | | | |
|---|---|---|---|
| DE | 4205102 | | 8/1993 |
| DE | 19516448 | | 11/1996 |
| EP | 0 785 557 | | 7/1997 |
| JP | 01223708 | | 9/1989 |
| JP | 2000-188173 | * | 7/2000 |
| JP | 2003115578 | | 4/2003 |

* cited by examiner

*Primary Examiner*—S. V. Clark
(74) *Attorney, Agent, or Firm*—Dicke, Billig, Czaja, PLLC

(57) ABSTRACT

The invention relates to an electronic component having a multilayered rewiring plate, which carries a circuit chip, in particular a magnetic memory chip, and connects contact areas of the chip to external contacts of the electronic component via rewiring lines. The rewiring plate has at least one patterned, magnetic shielding layer made of an amorphous metal or an amorphous metal alloy. Furthermore, the invention encompasses a method for producing this electronic component.

28 Claims, 5 Drawing Sheets

ELECTRONIC COMPONENT WITH MULTILAYERED REWIRING PLATE AND METHOD FOR PRODUCING THE SAME

CROSS REFERENCE TO RELATED APPLICATION

This Utility Patent Application claims the benefit of the filing date of Application No. DE 102 29 542.5, Jul. 1, 2002 and International Application No. PCT/DE03/02162, filed Jun. 30, 2003, both of which are herein incorporated by reference.

FIELD OF THE INVENTION

The invention relates to an electronic component having a multilayered rewiring plate, which carries a circuit chip, in particular a magnetic memory chip, and a method for producing the same.

BACKGROUND OF THE INVENTION

Electronic components having a semiconductor chip, in particular having a magnetic memory chip, are particularly jeopardized by magnetic fields from the surroundings of the electronic components, such as transformers, power supply units, fan motors and the like, it being possible for unintentional switching operations to be triggered in the circuit chips. Magnetic interference of just a few tenths of an Oersted can already trigger malfunctions, especially since the threshold values for a logic zero and a logic one are continuously being minimized with increasing miniaturization of the circuit cells. While electronic components on the basis of flat conductor frames have a limited protective effect by virtue of the metallic structures, said protective effect is completely eliminated in the case of electronic components on the basis of BGA type housings (ball grid array type).

Shieldings on the basis of permalloy or alloy 42 have the disadvantage of a high remanence for shielding large devices, so that these materials behave like a permanent magnet, that is to say that after they have been exposed to a magnetic field, they form a permanent inherent magnetic field and can thus impair or permanently damage the functionality of electronic components having a circuit chip. Therefore, the use of flat conductor frames made of such materials or shielding housings made of materials with high remanence can oppositely reverse the desired shielding effect for electronic components having a circuit chip, so that the circuit chip is permanently damaged by a remaining residual magnetic field on account of the high remanence of these materials.

SUMMARY

The invention provides an electronic component which has a structure that protects the circuit chip from magnetic interference fields and reduces malfunctions on account of magnetic interference in the region of several oersted without restricting the functionality of the electronic component.

The invention is described by the subject matter of the independent claims. Advantageous developments of the invention emerge from the subclaims.

In one embodiment, the invention provides an electronic component having a multilayered rewiring plate, which carries a circuit chip, in particular a magnetic memory chip. The rewiring plate has rewiring lines connecting contact areas of the chip to external contacts of the electronic component. At least one of the patterned layers of the multilayered rewiring plate is a magnetic shielding layer having an amorphous metal or an amorphous metal alloy.

Such a shielding layer made of an amorphous metal or an amorphous metal alloy is extremely mechanically hard and gives the rewiring plate a high dimensional stability. At the same time, amorphous magnetic metals or amorphous magnetic alloys are soft-magnetic, which has the advantage that these materials cannot be polarized by a magnetic field and, consequently, cannot form a permanent magnet effect. Moreover, what is achieved through the arrangement of the amorphous metal or the amorphous metal alloy as a layer of a rewiring plate is that the magnetic shielding layer can be arranged in direct proximity to the circuit chip to be protected, without changing or adapting the production method for the circuit chips itself. It is merely necessary to provide a further patterned layer in the multilayered rewiring plate.

The measure of integrating a magnetically shielding amorphous metal or an amorphous metal alloy as a further layer in a multilayered rewiring plate protects in particular circuit chips having magnetic memory cells against magnetic interference fields. Consequently, in particular so-called-MRAM (magnetic random access memories) components, with which the so-called TMR (tunneling magnetoresistive) or the GMR (giant magnetoresistive) effect is used for storing data, can be protected against magnetic interference fields. In the case of these components, a soft- or hard-magnetic layer is connected either in parallel or in antiparallel, a parallel connecting meaning a low contact resistance and an antiparallel connection meaning a high contact resistance, so that the memory function zero and one can be realized. In this case, the soft-magnetic layer serves as a switch and the hard-magnetic layer serves as a reference layer. However, only currents of limited magnitude are available for the switching of the soft-magnetic layer, so that the coercive field strength is to be kept as low as possible. Consequently, these switching states in the soft-magnetic layer are extremely susceptible to interference and malfunctions of such MRAM components are observed even at magnetic fields of a few tenths of an oersted.

With the aid of the multilayered rewiring plate according to the invention which has a magnetic shielding layer made of an amorphous ferromagnetic metal or an amorphous ferromagnetic metal alloy, it is possible to shield interference fields of several oersted in the surroundings of the electronic component which are caused by transformers, power supply units or fan motors.

Even though the use of the rewiring plate according to the invention is particularly effective in electronic components having magnetic memory cells, and actually ensures the functionality of such electronic components without the provision of large shielding housings for such electronic components, such a multilayered rewiring plate may also advantageously be used for circuit chips that have conventional memory cells or else for logic chips, especially since, on account of the electrical conductivity of these amorphous metals, a shielding effect is also effected with respect to electromagnetic interference fields which can influence the memory and switching functions. For this purpose, the magnetic shielding layer is merely adapted in its structure to the rewiring plate for the various circuit types.

In one embodiment, a patterned shielding film having a thickness of between 20 and 75 micrometers may be used as the shielding layer. Such shielding films made of amorphous ferromagnetic metals or metal alloys are produced in tape form and are particularly suitable for lamination onto the insulation core of a rewiring plate. For this purpose, it is merely necessary for the tape made of amorphous metal to be patterned and it can be laminated on for a plurality of electronic component positions of a rewiring plate of a panel.

In order to increase the shielding effect, the shielding layer may also have a plurality of stacked patterned shielding films laminated one on top of the other. By virtue of laminating a plurality of shielding films one above the other, it is possible to achieve a shielding factor of any desired magnitude, which lies between 50 and 100 for the electronic component according to the invention.

For effective magnetic shielding, the amorphous metals have at least one of the ferromagnetic materials cobalt, nickel or iron. Boron serves as an alloying addition, and promotes an amorphous solidification of the ferromagnetic metals, with the result that the crystalline portions in the magnetic shielding film are negligibly low.

The saturation induction is achieved at values of between 0.5 and 1 tesla, a saturation magnetorestriction of less than $0.2 \times 10^6$ being present. The magnetic shielding layer of the multilayered rewiring plate is extremely mechanically dimensionally stable and soft-magnetically effective. The Curie point lies between 200° C. and 500° C., with the result that the shielding effect is not destroyed even during temperature cycle tests of the electronic components that are carried out between −50° C. and 150° C.

The patterned shielding layer may be arranged on the outer side of the rewiring plate, which is opposite to the circuit chip. For this purpose, the shielding layer in the form of a shielding film has at least openings for the external contacts arranged in a predetermined pitch annularly or in a matrix. Even such a patterned shielding layer prevents a punch through of interference fields to the circuit chip and ensures an unrestricted functionality of the electronic component on account of the soft-magnetic properties of the amorphous metal layer.

The patterned shielding layer may also be arranged nearer to the chip side by laminating the patterned shielding layer on the chip side of the rewiring plate. For this purpose, at least for logic chips, the patterned shielding layer has openings for corresponding bonding contact areas. In the case of memory chips with or without magnetic memory cells, the patterned shielding layer, without changing the structure, may be arranged both on the chip side and on the outer side of the rewiring plate as long as the shielding layer has at least one bonding channel opening of the order of magnitude of the bonding channel of the circuit or memory chip. In the case of arrangement on the outer side of the rewiring plate, which is opposite to the chip side of the rewiring plate, it is possible to provide additional openings for uncovering external contact areas.

An alternative solution consists in the fact that the shielding layer, on the outer side of the rewiring plate, has only one bonding channel opening and the surface of the shielding layer is covered on the outside by an insulating layer which, for its part, has the rewiring lines and the external contact areas for a connection between the contact areas of the circuit chip and the external contacts. This alternative has the advantage over a shielding layer directly on the outer side of the electronic component that it is not necessary to provide precise openings for uncovering external contact areas.

The shielding effect of the shielding films made of amorphous metals or metal alloys may be reinforced by virtue of the fact that, in addition to the rewiring plate, the circuit chip has a shielding film made of amorphous metals or metal alloys over the whole area on its passive rear side. Surrounding the active front side of the circuit chip, which faces the rewiring plate in the case of memory chips, with soft-magnetic materials both on the passive rear side of the circuit chip and with an additional layer in the rewiring plate achieves an almost perfect protection against magnetic and electromagnetic interference fields for the active front side of the circuit chip and thus for the electronic component, without the electronic component having to be embedded in a shielding housing.

In one embodiment, a method for producing an electronic component having a multilayered rewiring plate, which carries at least one circuit chip and connects contact areas of the circuit chip to external contacts of the electronic component via rewiring lines of the rewiring plate, has the following method steps:

Firstly, a shielding film made of amorphous metal or an amorphous metal alloy is patterned for a panel with a plurality of component positions. Afterward, the patterned shielding film is laminated onto the rewiring plate of the panel. Circuit chips are subsequently applied in the component positions of the rewiring plate of the panel and electrically connected to the rewiring plate. The entire panel is then filled with a plastic housing composition with embedding of the circuit chips and of the electrical connections. In this case, the underside or else outer side having external contact areas remains free of plastic housing composition. Next, external contacts may be applied to the external contact areas on the entire panel in the respective component positions of the panel. After the application of the external contacts, the panel may be separated to form individual electronic components. In order to round off or deburr the edges of the plastic housing composition, it is possible to use profile saws when separating the component positions of the panel to form individual electronic components.

This method has the advantage that individual electronic components arise whose rewiring plate is multilayered and has at least one shielding layer made of an amorphous metal or an amorphous metal alloy. Said amorphous metal or said amorphous metal alloy has a magnetically and electromagnetically shielding effect and a protective effect for the functions of the circuit chip within the electronic component, without an outer shielding housing being necessary. Improved magnetic shielding for alternating fields is achieved on account of the soft-magnetic properties of the ferromagnetic amorphous metals or metal alloys. This shielding layer can effectively shield critical magnetic fields from transformers, power supply units or fan motors in the low-frequency range without the magnetic shielding layer made of amorphous metals or amorphous metal alloys itself being permanently magnetized, since the soft-magnetic material of amorphous metal has a low remanence.

The patterning of the shielding film may be effected by means of stamping predetermined patterns of openings. Thus, in an advantageous manner, an elongate bonding channel adapted to the arrangement of the contact areas on the memory chip may be introduced or stamped out into the shielding film for each component position in the case of circuit chips or in the case of chips having magnetic memory cells. By contrast, if the shielding film is applied or arranged on the outermost side of the rewiring plate, then provision is made of additional openings for uncovering or leaving free the external contact areas to which external contacts are applied in a later step.

The patterning of the shielding film may also be effected by means of laser removal or laser ablation, a laser beam being scanned over each of the component positions of a shielding film for a panel in such a way that correspondingly adapted openings arise. In the case of logic circuits, instead of bonding channels, individual annularly arranged openings are to be provided which free bonding contact areas on the rewiring plate if the shielding layer or shielding film is arranged on the chip side of the rewiring plate. By contrast, if the shielding film is provided for the outer side of the rewiring plate, then openings are to be correspondingly provided for a matrix of external contact areas, the edges or walls of said openings additionally having to be protected against short circuit with a soldering resist.

A shielding film that has been patterned and prepared in this way may subsequently either be applied directly to the insulation body of the rewiring plate or, if said body already has rewiring lines, then firstly a thin insulating layer is applied or an insulating adhesive is inserted during lamination, so that the applied rewiring lines are not short-circuited by the shielding film. This insulating layer may also already have been deposited on the shielding film, for which purpose magnesium oxides or silicon oxides or silicon nitride are preferably used. This deposition directly on the shielding film may also additionally be effected prior to the patterning of the shielding film in a sputtering installation.

In order to suitably set the shielding factor, it is possible either to vary the thickness of the shielding film between 20 and 75 micrometers or it is also possible to laminate a plurality of shielding films one on top of the other. Since the magnetostriction is negligibly low in the case of amorphous metals, lamination of shielding films one on top of the other is noncritical.

The shielding effect can also be reinforced by additionally providing either the rear side of the circuit chip or the active front side of the circuit chip with a shielding film. In this case, however, it must be taken into consideration that the rear side can be covered by a shielding film in closed fashion, while the active front side of a circuit chip requires a patterned shielding film that leaves the contact areas of the circuit chip free.

To summarize, it can be stated that there are in principle a number of possibilities for achieving a magnetic shielding of circuit chips.

1. Direct compensation of magnetic fields on the chip, undesired magnetization reversal being avoided in terms of circuitry. One disadvantage of this possibility is the high circuitry outlay for the circuit chip, the chip area of which thus simultaneously has to be enlarged, which causes high costs.
2. The chip can be shielded directly, a sputtering metallization made of magnetically conductive material being applied directly to the chip. This requires a higher complexity in the chip technology since use is made in part of materials such as ferromagnetic iron, nickel or cobalt or alloys thereof which are not usually used in semiconductor technology. Finally, there is the possibility, if the intention is to avoid a housing-related external shielding, to implement a so-called package shielding with permalloy or alloy 42 that is embedded in the plastic housing composition. The disadvantage of such a shielding cover in the plastic housing is that these magnetic fields are polarized in the magnetic field and, consequently, act on the circuit chip like a permanent magnet and thus restrict the function of the component.
3. Shieldings that are used for electromagnetic interference by applying thin copper layers for the electronic component cannot be used successfully in the case of purely magnetic interference in the surroundings of electronic components, such as from transformers, power supply units or fan motors, since these critical magnetic fields work in the low-frequency range, while the electromagnetic waves are at high frequency and, consequently, other shielding mechanisms occur.

The invention proposes laminating a novel magnetically conductive film made of amorphous metal, such as a boron/iron alloy or a boron alloy with ferromagnetic metals, such as cobalt or nickel, onto the rewiring plate of an electronic component. Such shielding films may have a thickness of 20 to 75 micrometers and achieve a shielding factor of between 50 and 100. This shielding according to the invention differs decisively from the electromagnetic shieldings which are produced from copper and also from shieldings which are based on permalloy films, which have the disadvantages already mentioned above.

What is more, the shielding effect of permalloy films has a high dependence on temperature, which is not the case with the shielding film according to the invention having a Curie point of between 200° C. and 500° C. Furthermore, these known films exhibit low mechanical loadability and do not have the suitable hardness such as is afforded by the shielding film according to the invention. For the shielding film, the invention uses an amorphous metal of high permeability which has a thickness of at least 20 micrometers and at most of 75 micrometers, although any desired thickness can be achieved by stacking films, especially since the magnetostriction is negligibly low and, consequently, delamination of the stacked film does not occur.

BRIEF DESCRIPTION OF THE DRAWINGS

The invention is now explained in more detail on the basis of exemplary embodiments with reference to the accompanying figures.

DETAILED DESCRIPTION

Figure 1:
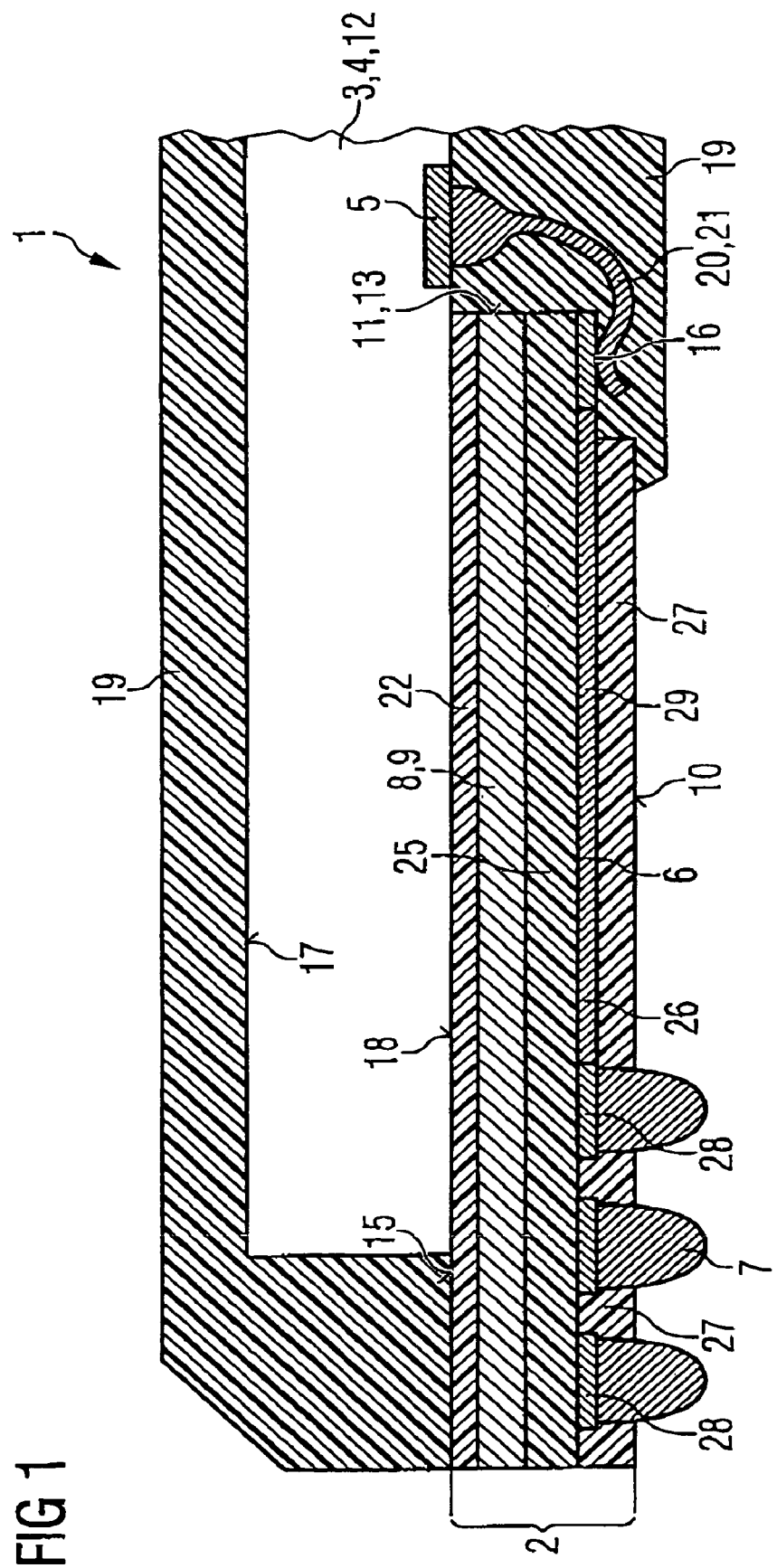
FIG. 1 illustrates a schematic cross section through an electronic component of a first embodiment of the invention.

FIG. 1 illustrates a schematic cross section through an electronic component 1 of a first embodiment of the invention. The electronic component 1 has a multilayered rewiring plate 2, which carries a circuit chip 3, the circuit chip 3 being oriented and mounted with its active top side 18 and an insulating adhesive film 22 on the rewiring plate 2. The multilayered rewiring plate 2 has a carrier layer 25 made of crosslinked plastic, which may be reinforced by glass fibers or carbon fibers. The plastic layer 25 carries a magnetic shielding layer 8 made of amorphous metal or an amorphous metal alloy preferably based on iron, cobalt or nickel with alloying additions, for example made of boron, which has soft-magnetic properties despite high mechanical hardness with a modulus of elasticity of 150 GPa, a tensile strength of between 1000 and 3000 MPa and a Vickers hardness between 900 and 1100.

The soft-magnetic properties shield the memory chip 12 from magnetic interference fields such as may occur due to transformers, power supply units or fan motors in the vicinity of such an electronic memory module. On account of the soft-magnetic properties of the shielding layer with a thickness of between 20 and 75 micrometers, it is ensured, owing to the amorphous materials, that said layer itself cannot be permanently magnetized, so that the memory chip and its functionality are not impaired.

In this embodiment of the invention, the outer side 10 of the rewiring plate 2 is simultaneously the underside of the electronic component 1. The external contacts 7 of the electronic component 1 are arranged on the outer side 10 of the rewiring plate 2, and are connected to contact areas 5 of the memory chip 12 via a rewiring structure 29 comprising external contact areas 28, rewiring lines 6 and bonding contact areas 16 via bonding connections 21 in a bonding channel opening 13. The outermost layer of the multilayered rewiring plate 2 is formed by a soldering resist layer 27, which covers the rewiring lines 6 and leaves the external contacts 7 or the external contact areas 28 free.

The bonding connections 21 in the bonding channel are embedded in a plastic housing composition 19 and thus protected against mechanical and electrical interference. The layer construction of the multilayered rewiring plate, as seen from the memory chip, thus has firstly an adhesive film 22, then the magnetic shielding layer 8, which comprises a shielding film 9 in this case, and is carried by a plastic layer 25, which, for its part, is plated with a copper structure 26, and, as concluding outer layer, a soldering resist layer 27 protects the rewiring structure 29 of the rewiring plate 2 against external damage and against electrical short circuits and also against wetting by the external contact material of the external contact 7 during soldering onto a superordinate circuit of a printed circuit board.

While the reference symbol 10 identifies the underside of the electronic component 1 and simultaneously the outer side of the multilayered rewiring plate 2, the chip side of the multilayered rewiring plate 2 is identified by the reference symbol 15. The memory chip 12 is embedded in a plastic housing composition 19 in this embodiment of the invention. This plastic housing composition 19 can simultaneously be applied to the semiconductor chip for a plurality of electronic components that are produced on a panel, the plastic housing composition 19 also simultaneously being introduced into the bonding channel opening. The bonding channel opening 13 for the individual layers 22, 8 and 25 may be introduced into each layer individually prior to lamination of the layers in the latter if said layers are present as independent films or plates. Another possibility is to introduce the bonding channel opening in one work step after lamination of these three basic layers 22, 8 and 25.

However, since the materials of an adhesive film 15 for the adhesive layer 24 of the rewiring plate 2 and the materials of the shielding film 9 for the shielding layer 8 and also the materials of the plastic layer for the carrier plate differ significantly from one another in terms of their processability, these three layers are prepatterned in film form and subsequently laminated one on top of the other. In this case, the plastic layer 25 already has the rewiring structure 29, which, for its part, may already be provided with a soldering resist layer 27. In this embodiment of the invention, the protection against magnetic interference fields is effected merely by the shielding layer 8 of the multilayered rewiring plate 2, so that the circuit chip 3 is protected against magnetic interference fields only on one side.

Figure 2:
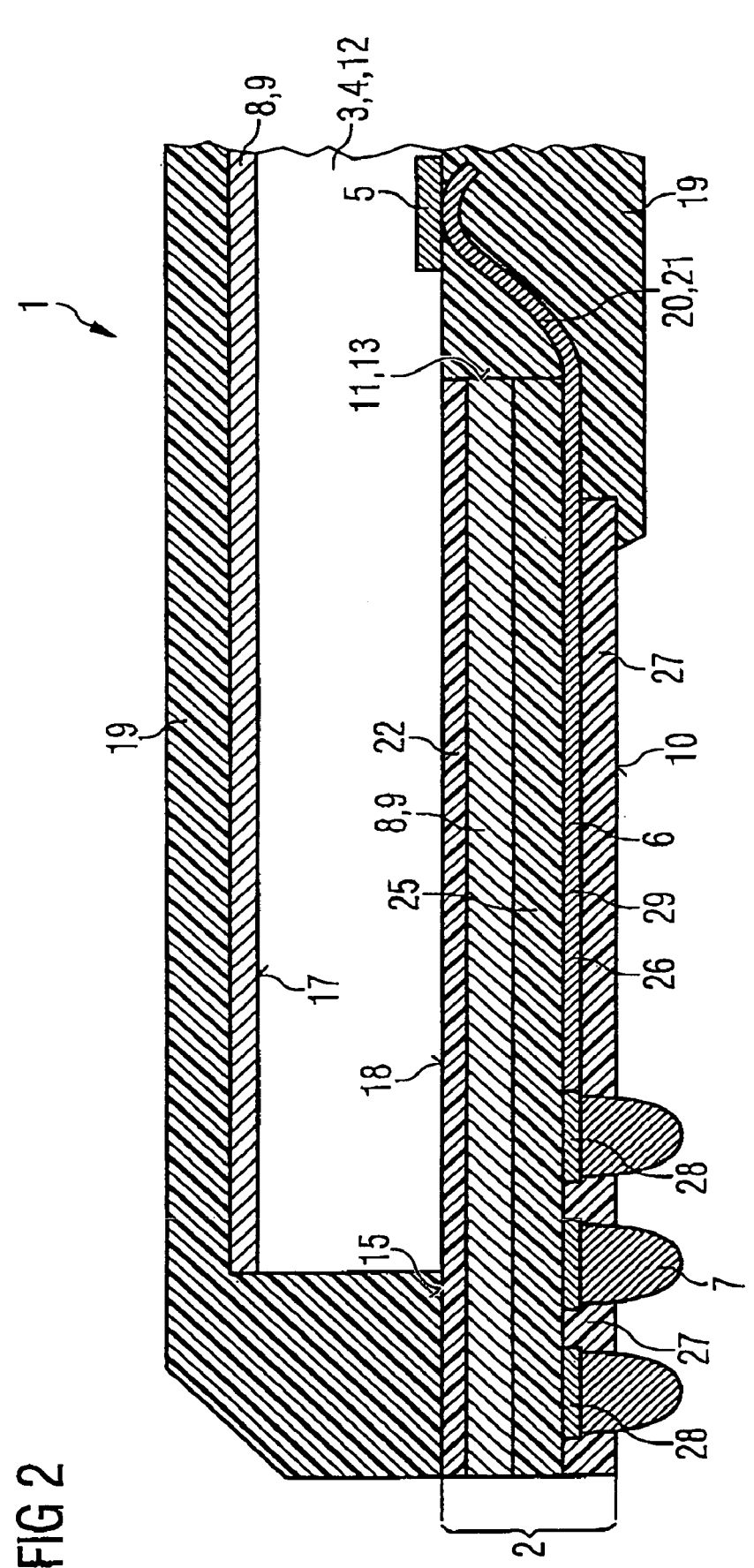
FIG. 2 illustrates a schematic cross section through an electronic component of a second embodiment of the invention.

FIG. 2 illustrates a schematic cross section through an electronic component of a second embodiment of the invention. Components having functions identical to those in the previous figures are identified by the same reference symbols and are not discussed separately.

The construction of the multilayered rewiring plate 2 of the second embodiment of the invention corresponds to the rewiring plate 2 of the first embodiment of the invention since, in this case as well, a memory chip 12, which may also constitute a magnetic memory chip, by way of example, is intended to be protected against magnetic interference fields. In contrast to the first embodiment, this second embodiment of the invention provides for a nonpatterned shielding film 9 to be laminated onto the passive rear side 17 of the memory chip 12. The sensitive active front side 18 of the semiconductor chip is thus enclosed by shielding films 9 which, on the one hand, are arranged on the rear side of the semiconductor chip and, on the other hand, form a layer of the multilayered rewiring plate 2.

A further difference between this second embodiment of the invention and the first embodiment of the invention consists in the use of a flat bonding tape for the bonding connection 21 in the bonding channel opening 13. Said bonding tape having a thickness of less than 10 micrometers is practically an extension of the conductor track 6 of the rewiring structure 29. Besides the advantage of the active front side 18 of the memory chip 12 being shielded on both sides by an amorphous metal or a corresponding amorphous metal alloy as in the first embodiment of the invention, this electronic component 1 has the further advantage that the bonding connection 21 can be made significantly flatter than in the first embodiment of the invention.

Figure 3:
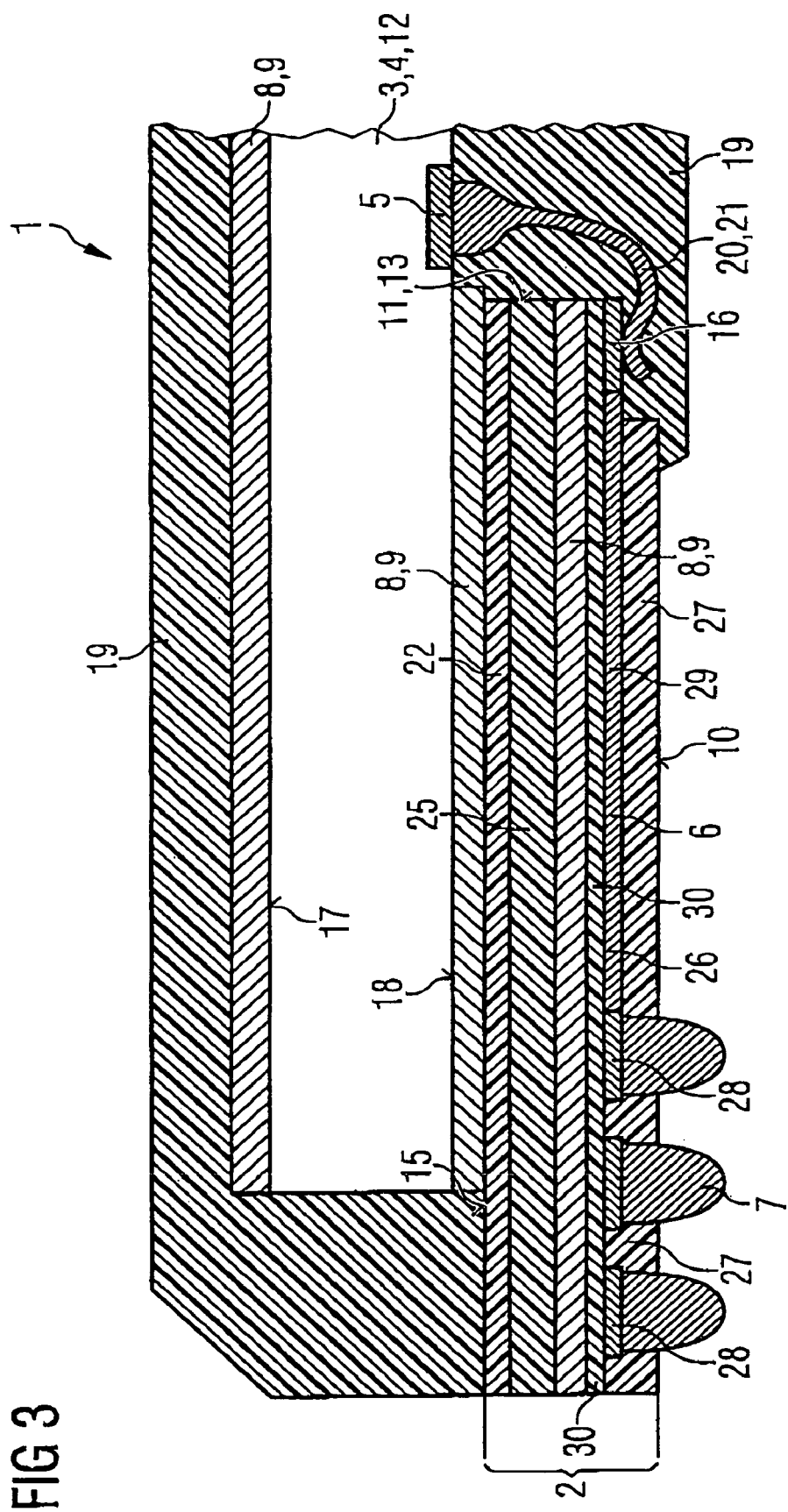
FIG. 3 illustrates a schematic cross section through an electronic component of a third embodiment of the invention.

FIG. 3 illustrates a schematic cross section through an electronic component 1 of a third embodiment of the invention. In this case, too, a memory chip having electronic memory cells or a memory chip having magnetic memory cells is intended to be protected against the interference fields. Components having functions identical to those in the previous figures are identified by the same reference symbols and are not discussed separately.

The arrangement of the layers in the multilayered rewiring plate 2 is changed in this embodiment of the invention, such that the shielding layer 8 in the form of a shielding film 9 is arranged on the external contact side of the rewiring plate 2 and the plastic layer 25 lies on the chip side 15 of the rewiring plate. For this purpose, the shielding layer 8 has an additional insulating layer 30, for example made of an Ormocer material, which is a few micrometers thick and, for its part, carries the rewiring structure 29 on which, in turn, the soldering resist layer is applied.

Furthermore, provision is made of further shielding films 9 for magnetically shielding the memory chip 12 by virtue of the fact that a nonpatterned shielding film 9 is laminated on the rear side 17 of the memory chip 12 and a shielding film 9 patterned with a bonding channel opening 13 is also laminated on the front side 18 of the memory chip 12. Such additional shielding layers 8 directly on the memory chip are useful when the shielding factor of the shielding layer 8 made of amorphous metal or a metal alloy in the rewiring plate 2 is insufficient.

As an alternative, the shielding layer 8 in the rewiring plate 2 may also be embodied in multilayered fashion by laminating a plurality of shielding films 9 one above the other. However, such a stack in the rewiring plate 2 cannot protect the memory chip 12 against magnetic interference from the rear side 17, so that it may become necessary to laminate a stack of shielding films 9 on the rear side 7 of the memory chip 12 in cases of large magnetic interference fields.

Figure 4:
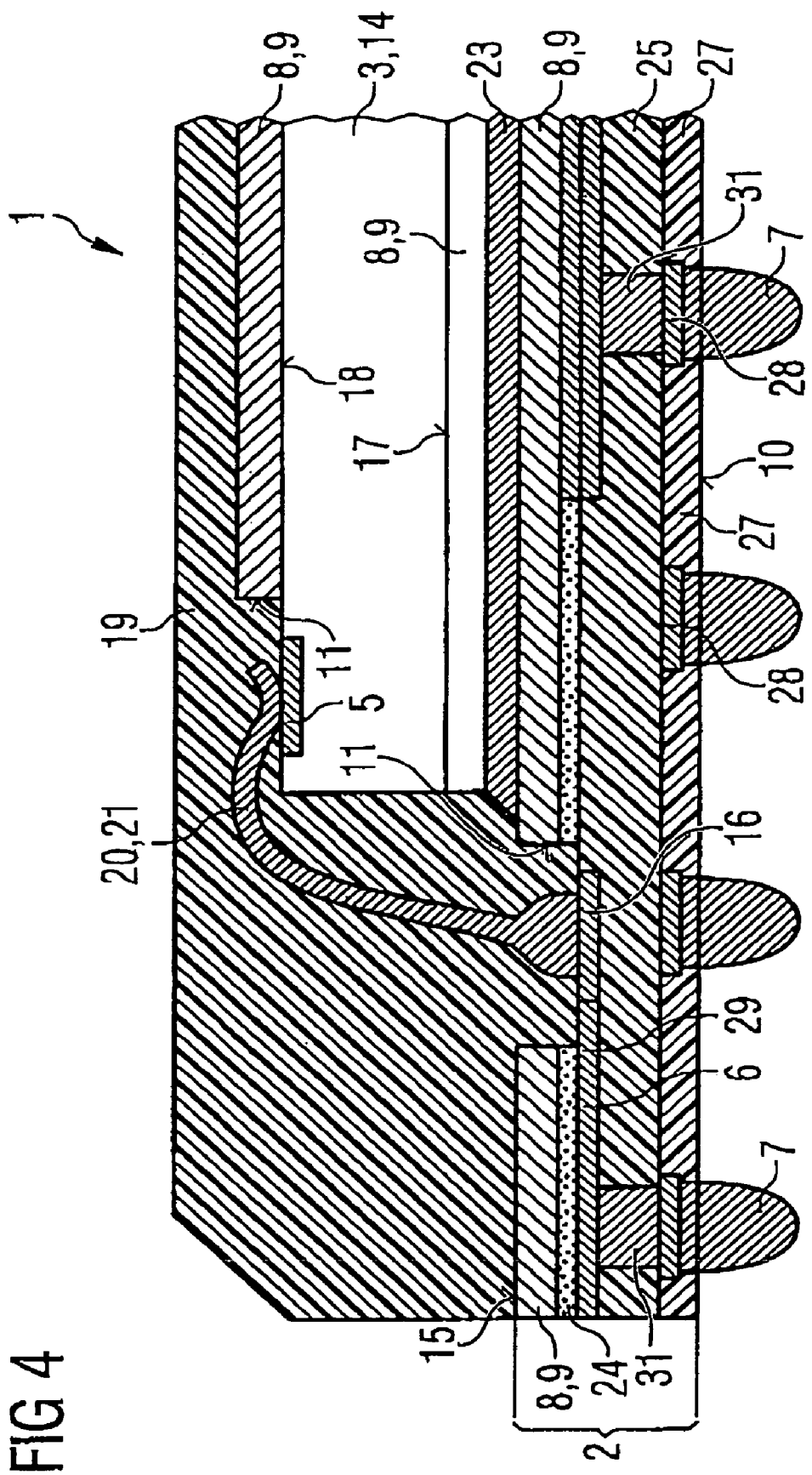
FIG. 4 illustrates a schematic cross section through an electronic component of a fourth embodiment of the invention.

FIG. 4 illustrates a schematic cross section through an electronic component 1 of a fourth embodiment of the invention. Components having functions identical to those in the previous figures are identified by identical reference symbols and are not discussed separately.

The circuit chip 3 to be protected by means of the fourth embodiment of the invention is a logic chip 14, which is not directed toward the rewiring plate 2 with its active top side 18, but rather is arranged oppositely, so that its passive rear side 17 is connected on the rewiring plate 2 via an adhesive layer 23, which is electrically conductive in this case. The multilayered rewiring plate 2 has, toward the chip side 15, a patterned shielding layer 8 in the form of a shielding film 9 which is patterned in such a way that it frees openings 11 for bonding contact areas 16 of a rewiring structure 29. The shielding layer 8 made of amorphous metal is laminated onto the rewiring structure 29 of the plastic layer with the aid of an insulating adhesive or an insulating adhesive layer 24.

In this fourth embodiment of the invention, the plastic layer 25 has through contacts 31, via which the rewiring structure 29 is electrically connected to the external contact 7. Via such a through contact 31, the rear side 17 of the logic chip 14 can also be connected to an external contact 7 for example for grinding or for connection to the lowest potential of the integrated circuit of the logic chip 14. This electrical connection is achieved via the rewiring film 9 on the rear side 17 of the semiconductor chip, and electrically conductive adhesive layer 23, a further shielding film 9 made of electrically conductive, magnetically shielding amorphous metal or a corresponding metal alloy and finally via electrical contact areas made of copper and corresponding solder areas and also via a through contact 31 and an external contact area 28 to the external contact 7.

Consequently, the underside of the logic chip 14, with two shielding films 9 that are stacked one on top of the other and are connected to one another via a conductive adhesive 23, is protected against magnetic interference, while the active top side 18 can be additionally protected by a patterned shielding film 9. Said patterned shielding film 9 has openings 11 for leaving the contact areas 5 of the logic chip 14 free, so that these contact areas 5 of the logic chip 14 are accessible at the edge of the logic chip for a bonding connection 21.

Figure 5:
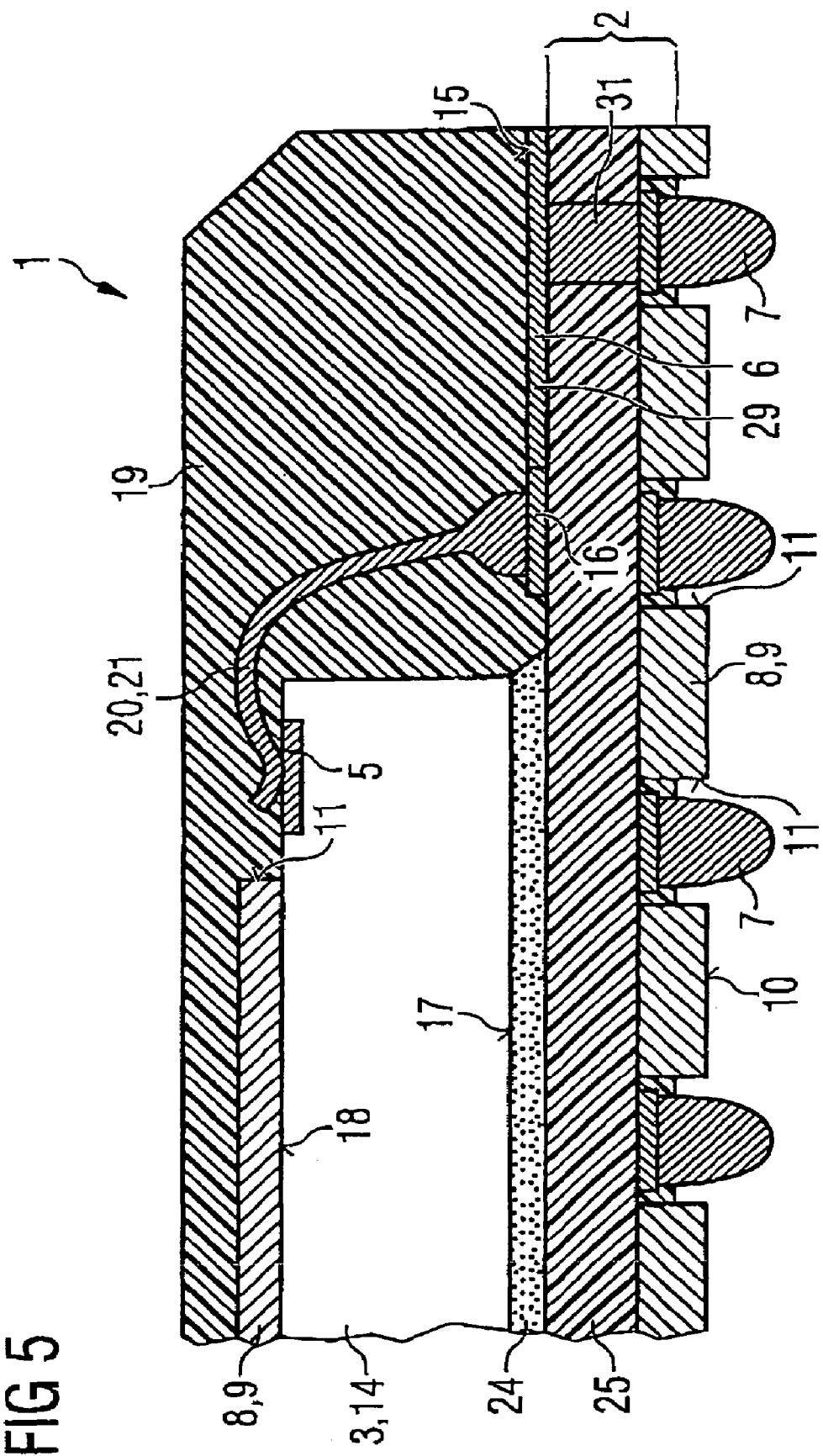
FIG. 5 illustrates a schematic cross section through an electronic component of a fifth embodiment of the invention.

FIG. 5 illustrates a schematic cross section through an electronic component 1 of a fifth embodiment of the invention. Components having functions identical to those in the previous embodiments are identified by the same reference symbols and are not discussed separately.

The difference between the fifth embodiment of the invention and the fourth embodiment of the invention is that a shielding film 9 is arranged on the outer side of the electronic component. For this purpose, the patterned shielding film 9 has openings 11 for the external contacts 7. In addition, the external contacts 7 are surrounded by a soldering resist 11 which simultaneously insulates the external contacts 7 from the shielding film 9 on the underside of the electronic component 1. In this embodiment of the invention as well, the shielding is used for a logic chip 14 which has contact areas 5 in its edge region, which contact areas, in the case of the active top side 18 of the semiconductor chip being shielded with a shielding film 9, have to be cut out through corresponding openings 11 in the shielding film.

In this embodiment, too, the rear side 17 of the logic chip 14 may be connected to one of the external contacts 7 via a through contact, but this is not shown in the cross section of FIG. 5 that is illustrated here. In such a simple embodiment of the invention, the rewiring plate 2 merely comprises three layers, namely a layer which has the rewiring structure 29 with corresponding rewiring lines 6, furthermore a plastic layer 25, which carries the rewiring structure and has through contacts 31, and also a shielding layer 8 made of a shielding film 9 with corresponding openings 11 for the external contacts 7 of the electronic component. In the fifth embodiment of the invention as well, as in the fourth embodiment of the invention, the connection between contact areas 5 of the logic chip 14 and the rewiring structure 29 is achieved via a bonding connection 21.

The invention claimed is:

1. An electronic component comprising:
   a multilayered rewiring plate;
   a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the shielding layer has a plurality of stacked shielding films laminated one on top of the other.

2. The electronic component of claim 1, comprising wherein the circuit chip has magnetic memory cells.

3. The electronic component of claim 1, comprising wherein the circuit chip is a logic chip.

4. The electronic component of claim 1, comprising wherein the shielding layer is a patterned shielding film having a thickness of between 20 and 75 micrometers.

5. The electronic component of claim 1, comprising wherein the amorphous metal comprises a cobalt or cobalt alloy.

6. The electronic component of claim 1, comprising wherein the circuit chip has a shielding film on its rear side.

7. An electronic component comprising:
   a multilayered rewiring plate;
   a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the amorphous metal comprises a boron/iron alloy.

8. The electronic component of claim 7, comprising wherein the shielding layer has a plurality of stacked shielding films laminated one on top of the other.

9. An electronic component comprising:
   a multilayered rewiring plate;
   a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the amorphous metal has a saturation induction of between 0.5 and 1 tesla.

10. An electronic component comprising:
    a multilayered rewiring plate;
    a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the amorphous metal has a saturation magnetostriction of less than $0.2 \times 10^{-6}$.

11. An electronic component comprising:
    a multilayered rewiring plate;
    a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the amorphous metal has a Curie point of between 200° C. and 500° C.

12. An electronic component comprising:
a multilayered rewiring plate;
a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the patterned shielding layer is arranged on the outer side of the rewiring plate which is opposite to the circuit chip, the shielding film having at least openings for external contacts arranged in a predetermined pitch annularly or in a matrix.

13. An electronic component comprising:
a multilayered rewiring plate;
a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the patterned shielding layer of the rewiring plate of a memory chip has at least one bonding channel opening.

14. An electronic component comprising:
a multilayered rewiring plate;
a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the patterned shielding layer is arranged on the chip side of the rewiring plate and has at least openings for bonding contact areas.

15. An electronic component comprising:
a multilayered rewiring plate;
a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the circuit chip has a patterned shielding film on its active front side in which shielding film at least openings for the contact areas of the circuit chips are provided.

16. An electronic component comprising:
a multilayered rewiring plate;
a circuit chip carried on the rewiring plate, wherein the rewiring plate connects contact areas of the chip to external contacts of the electronic component via rewiring lines, the rewiring plate having at least one patterned, magnetic shielding layer made of an amorphous metal or an amorphous metal alloy, wherein the shielding layer on the rewiring plate has at least a shielding factor of between 50 and 100.

17. A method for producing an electronic component comprising:
defining the electronic component to include a multilayered rewiring plate, which carries at least one circuit chip and connects contact areas of the circuit chip to external contacts of the electronic component via rewiring lines, the rewiring plate having at least one patterned, magnetic shielding layer made of an amorphous metal or an amorphous metal alloy;
patterning of a shielding film made of amorphous metal or an amorphous metal alloy for a panel with a plurality of component positions;
laminating the patterned shielding film onto the rewiring plate of the panel;
applying and electrical connecting of circuit chips in the component positions of the rewiring plate of the panel;
applying a plastic housing composition to the panel embedding the circuit chips and the electrical connections;
applying external contacts in the component positions of the panel; and
singulating the component positions of the panel to form individual electronic components.

18. The method of claim 17, comprising:
stamping predetermined patterns of openings to define the patterning of the shielding films.

19. The method of claim 17, comprising:
using laser removal to pattern the shielding films.

20. The method of claim 17, comprising patterning of the shielding films by etching methods through an etching mask.

21. The method of claim 17 comprising:
prior to the application of the circuit chips to the chip side of the rewiring plate, which carries the circuit chips, the patterned shielding film is laminated on, leaving the areas provided for the bonding connections free.

22. The method according of claim 17, comprising laminating the patterned shielding film onto the outer side of the rewiring plate, which carries the external contacts, with the areas provided for the external contacts being left free.

23. The method according to one of claims 17, comprising:
in the component positions of the panel, applying the circuit chips with magnetic memory cells to the rewiring plate.

24. The method of claim 17, comprising:
in the component positions of the panel, applying circuit chips with logic circuits to the rewiring plate.

25. The method of claim 17, comprising:
laminating a plurality of patterned shielding films one on top of the other.

26. The method of claim 17, comprising:
applying shielding films on the rear sides of the circuit chips, prior to the application of the circuit chips to the rewiring plate.

27. The method of claim 17, comprising:
applying patterned shielding films on the active front side of the circuit chips with the contact areas of the circuit chips being left free, prior to the application of the circuit chips to the rewiring plate.

28. An electronic component comprising:
a multilayered rewiring plate;
a circuit chip carried on the rewiring plate, wherein the rewiring plate includes connecting means for connecting contact areas of the chip to external contacts of the electronic component via rewiring lines, the rewiring plate having at least one patterned, magnetic shielding layer made of an amorphous metal or an amorphous metal alloy, wherein the shielding layer has a plurality of stacked shielding films laminated one on top of the other.

* * * * *